(12) United States Patent
Kim

(10) Patent No.: US 10,972,037 B2
(45) Date of Patent: Apr. 6, 2021

(54) MOTOR CONTROL APPARATUS AND METHOD FOR VEHICLE

(71) Applicant: MANDO CORPORATION, Gyeonggi-do (KR)

(72) Inventor: Tae Sik Kim, Gyeonggi-do (KR)

(73) Assignee: MANDO CORPORATION, Gyeonggi-Do (KR)

( * ) Notice: Subject to any disclaimer, the term of this patent is extended or adjusted under 35 U.S.C. 154(b) by 0 days.

(21) Appl. No.: 16/420,137

(22) Filed: May 22, 2019

(65) Prior Publication Data

US 2019/0393820 A1 Dec. 26, 2019

(30) Foreign Application Priority Data

Jun. 20, 2018 (KR) .................. 10-2018-0070913

(51) Int. Cl.
| | |
|---|---|
| *H02P 27/06* | (2006.01) |
| *B62D 5/04* | (2006.01) |
| *G01R 19/165* | (2006.01) |
| *H02H 7/08* | (2006.01) |

(52) U.S. Cl.
CPC ............. *H02P 27/06* (2013.01); *B62D 5/046* (2013.01); *G01R 19/165* (2013.01); *H02H 7/0844* (2013.01)

(58) Field of Classification Search
CPC ....... H02P 27/06; B62D 5/046; G01R 19/165; H02H 7/0844
See application file for complete search history.

(56) References Cited

U.S. PATENT DOCUMENTS

| | | | |
|---|---|---|---|
| 2017/0349207 A1* | 12/2017 | Maeshima | ............ H02P 29/027 |
| 2019/0363664 A1* | 11/2019 | Nakamura | ........... B62D 5/0484 |
| 2020/0083826 A1* | 3/2020 | Woo | ..................... B62D 5/0463 |

* cited by examiner

*Primary Examiner* — Said Bouziane
(74) *Attorney, Agent, or Firm* — Ladas & Parry, LLP

(57) ABSTRACT

A motor control apparatus and method for a vehicle. A motor includes windings respectively including coils. Inverters supply electric power to one of the windings to drive the motor. Controllers control the inverters to control the operation of the motor. The windings, the inverters and the controllers are set as a plurality of power supply lines respectively including a winding, an inverter and a controller. One of the power supply lines, in which at least one of the winding, the inverter or the controller has malfunctioned, is determined as having malfunctioned. Electric power that has been supplied via the power supply line determined as having malfunctioned is controlled to supplement power of another power supply line. Redundancy is obtained in the operation of a variety of motors provided in the vehicle, and the vehicle travels reliably.

18 Claims, 12 Drawing Sheets

MOTOR CONTROL APPARATUS AND METHOD FOR VEHICLE

CROSS REFERENCE TO RELATED APPLICATION

This application claims priority to Korean Patent Application No. 10-2018-0070913, filed on Jun. 20, 2018, which is hereby incorporated by reference for all purposes as if fully set forth herein.

BACKGROUND

Field

The present disclosure relates to an apparatus and method for controlling a motor provided in a vehicle.

Description of Related Art

In general, a vehicle is provided with a variety of systems for operations thereof. For example, a steering system of a vehicle is a system able to adjust steering angles of wheels based on steering force (or torque) applied to the steering wheel of the vehicle by a driver of the vehicle. Recently, electric power steering (EPS) systems have been used in vehicles to provide reliability of steering by reducing the amount of steering force necessary to be applied to the steering wheel.

Such an electric power steering system may drive a motor, depending on the speed and torque of a vehicle, to provide a driver of the vehicle with optimum steering states. Specifically, a light and convenient steering sensation may be provided in the case of low-speed travel, while a heavy and safe steering sensation may be provided in the case of high-speed travel. In an emergency situation, rapid steering may be enabled.

Recently, for motors provided in systems directly and indirectly influential in the safe travel of vehicles, such as a vehicle steering system, not only demand for performance improvements, but also demand for redundancy and reliability, is increasing.

BRIEF SUMMARY

Various aspects of the present disclosure provide a motor control apparatus and method for a vehicle. If at least one of a winding, an inverter or a controller of a single power supply line has malfunctioned or is broken, the motor control apparatus and method allows electric power that has been supplied via the malfunctioning power supply line to be supplied via another power supply line, thereby maintaining the power output of the motors at a reliable level, so that redundancy can be obtained in the operation of a variety of motors provided in the vehicle.

Also provided are a motor control apparatus and method for a vehicle, by which an inverter that has been controlled by a malfunctioning controller among a plurality of controllers can be controlled by another controller, so that redundancy can be obtained in the operation of a variety of motors provided in the vehicle.

According to an aspect of the present disclosure, a motor control apparatus for a vehicle may include: a motor including a plurality of windings respectively including a plurality of coils; a plurality of inverters supplying electric power to one of the plurality of windings to drive the motor; and a plurality of controllers controlling the plurality of inverters to control an operation of the motor. The plurality of windings, the plurality of inverters and the plurality of controllers may be set as a plurality of power supply lines respectively including a single winding, a single inverter and a single controller. The plurality of controllers may determine a power supply line among the plurality of power supply lines, in which at least one of the winding, the inverter or the controller has malfunctioned, as having malfunctioned, and control electric power that has been supplied via said power supply line determined as having malfunctioned to be supplied via another power supply line among the plurality of power supply lines.

According to another aspect of the present disclosure, provided is a method of controlling a motor for a vehicle, the motor including a plurality of windings respectively including a plurality of coils. The method may include steps of: controlling a plurality of inverters driving the motor using a plurality of controllers by supplying electric power to one winding among the plurality of windings; setting the plurality of windings, the plurality of inverters, and the plurality of controllers as a plurality of power supply lines respectively including a single winding among the plurality of windings, a single inverter among the plurality of inverters, and a single controller among the plurality of controllers; and determining a power supply line among the plurality of power supply lines, in which at least one of the winding, the inverter or the controller has malfunctioned, as having malfunctioned; and controlling electric power that has been supplied via said power supply line determined as having malfunctioned to be supplied via another power supply line among the plurality of power supply lines.

In the motor control apparatus and method for a vehicle according to exemplary embodiments, if at least one of the winding, the inverter or the controller of a single power supply line has malfunctioned or is broken, electric power that has been supplied via the malfunctioning power supply line can supplement power of another power supply line, thereby maintaining the power output of the motors at a reliable level, so that redundancy can be obtained in the operation of a variety of motors provided in the vehicle.

In addition, in the motor control apparatus and method for a vehicle according to exemplary embodiments, the inverter that has been controlled by the malfunctioning controller among the plurality of controllers can be controlled by another controller, so that redundancy can be obtained in the operation of a variety of motors provided in the vehicle.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION

Figure 1:
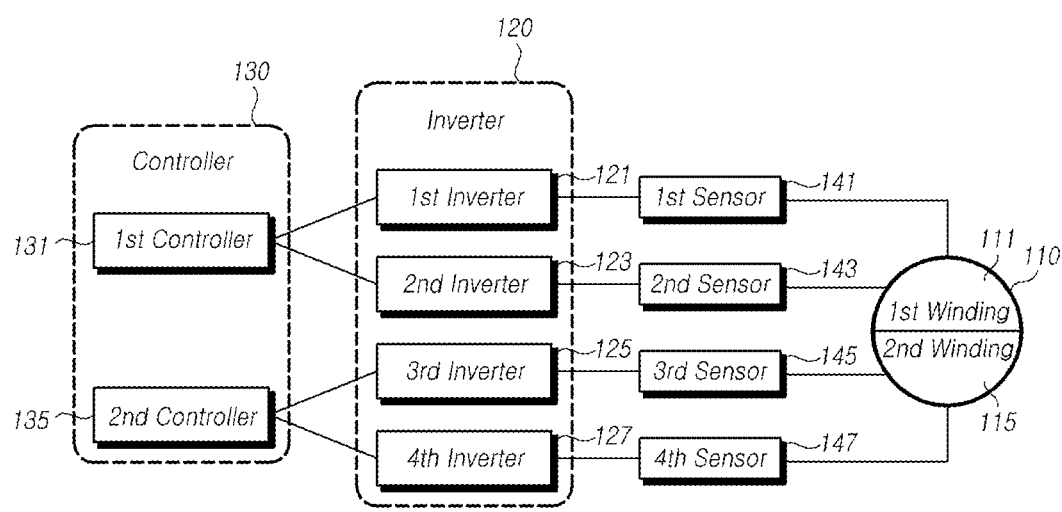
FIG. 1 is a block diagram illustrating a motor control apparatus for a vehicle according to the present disclosure.

Hereinafter, reference will be made to embodiments of the present disclosure in detail with reference to the illustrative drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element.

Unless otherwise specified, all terms including technical and scientific terms used herein have the same meaning as commonly understood by a person having ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The terms used herein are defined in consideration of functions thereof in embodiments of the present disclosure, but may vary depending on the intentions of users or operators, as well as practices. Therefore, the terms shall be defined on the basis of the description throughout the specification.

Hereinafter, a motor control apparatus and method for a vehicle according to exemplary embodiments will be described with reference to the accompanying drawings.

FIG. 1 is a block diagram illustrating a motor control apparatus 100 for a vehicle according to the present disclosure.

Referring to FIG. 1, the motor control apparatus 100 for a vehicle includes a motor 110 including a plurality of windings, a plurality of inverter 120 supplying electric power to one of the plurality of windings to drive the motor 110 and a plurality of controllers 130 controlling the plurality of inverters to control the operation of the motor 110.

The motor 110 may be used for a variety of systems provided in a vehicle to supply power to the systems under the control of the controller. For example, the motor 110 may be provided in the steering system of a vehicle to output steering force to provide an optimal steering state when the driver of the vehicle manipulates the steering wheel. However, this is illustrative only, and the present disclosure is not limited thereto. Although the following description will be mainly focused on the steering system, the present disclosure may be applied to a variety of systems, such as a micro control unit (MCU), an inverter and a motor, provided in a vehicle.

The motor 110 may include a plurality of windings. Although the motor 110 is illustrated as including two windings 111 and 115 in FIG. 1 according to an embodiment of the present disclosure, the motor according to the present disclosure is not limited thereto. The number of windings of the motor 110 is not limited to a specific number, as long as the following description of the present disclosure may be applied in substantially the same manner.

In the present disclosure, the windings may be coil groups respectively comprised of coils wound on the motor. A case in which the motor 110 includes twelve (12) coils wound on the stator and eight (8) magnetic bodies provided on the rotor will be taken as an example. In a case in which three-phase power is applied to the motor 110, the twelve coils may be categorized by a multiple of three to provide windings. For example, in a case in which the motor 110 includes two windings, power of U, V and W phases is applied to one winding comprised of six coils, while power of U', V' and W' phases is applied to the other winding comprised of six coils.

The plurality of inverters 120 may generate electric current by converting a direct current (DC) voltage into an alternating current (AC) voltage and provide the generated electric current to one winding among the plurality of windings of the motor, under the control of the plurality of controllers 130. For example, in a case in which the motor of the steering system is taken, the plurality of inverters 120 may supply power to the motor 110 so that the motor 110 can operate using the power calculated by the plurality of controllers 130 in response to the driver performing a steering operation.

The plurality of inverters 120 may include a plurality of inverters. Although the plurality of inverters 120 are illustrated as including four inverters 121, 123, 125 and 127 in FIG. 1, the present disclosure is not limited thereto. The number of the inverters provided in the plurality of inverters 120 is not limited to a specific number, as long as the following description of the present disclosure may be applied in substantially the same manner.

According to an embodiment, as illustrated in FIG. 1, the first inverter 121 and the second inverter 123 of the plurality of inverters 120 may supply current to the first winding 111 of the motor 110. In addition, the third inverter 125 and the fourth inverter 127 of the plurality of inverters 120 may supply current to the second winding 115 of the motor 110.

In this case, each of the four inverters 121, 123, 125 and 127 may be controlled to provide 25% of rated current of the motor 110. However, this is illustrative only, and the present disclosure is not limited thereto. As long as a total amount of current supplied by the four inverters 121, 123, 125 and 127 is 100% of rated current, the current supplied by each of the inverters may be differently controlled as required.

The plurality of controllers 130 may control the overall operation of the motor control apparatus 100 for a vehicle. For example, in the case of the steering system, the plurality of controllers 130 may calculate an amount of steering force by which an optimal steering state can be provided, in response to a steering operation performed by the driver of the vehicle, so that the plurality of inverters 120 may be controlled to operate the motor 110.

The plurality of controllers 130 may include a plurality of controllers. Each of the controllers may be implemented as a micro control unit (MCU). Although the plurality of controllers 130 are illustrated as including two controllers 131 and 135 in FIG. 1 according to an embodiment of the present disclosure, the present disclosure is not limited thereto. The number of controllers of the plurality of controllers 130 is not limited to a specific number, as long as the following description of the present disclosure may be applied in substantially the same manner.

According to an embodiment, as illustrated in FIG. 1, the first controller 131 may control the first inverter 121 and the second inverter 123, while the second controller 135 may control the third inverter 125 and the fourth inverter 127.

In this case, the two controllers 131 and 135 may control the four inverters 121, 123, 125 and 127 so that each of the four inverter supplies an amount of current equal to 25% of rated current to the motor 110. However, this is illustrative only, and the present disclosure is not limited thereto. As long as a total amount of current supplied by the plurality of inverters 120 is 100% of rated current, the current supplied by each of the inverters may be differently controlled as required.

Referring to FIG. 1, connection circuits connecting the components of the motor control apparatus 100 for a vehicle are represented by solid lines. The first controller 131 may be connected to the first inverter 121 and the second inverter 123 via connection circuits. The second controller 135 may be connected to the third inverter 125 and the fourth inverter 127 via connection circuits. In addition, the first inverter 121 and the second inverter 123 may be connected to the first winding 111 via connection circuits. The third inverter 125 and the fourth inverter 127 may be connected to the second winding 115 via connection circuits.

According to an embodiment of the present disclosure, the plurality of windings, the plurality of inverters and the plurality of controllers may be set as a plurality of power supply lines, each of which consists of a single winding, a single inverter and a single controller. For example, the first winding 111, the first inverter 121 and the first controller 131 may be set as a first line. Similarly, the first winding 111, the second inverter 123 and the first controller 131 may be set as a second line. In addition, the second winding 115, the third inverter 125 and the second controller 135 may be set as a third line. In addition, the second winding 115, the fourth inverter 127 and the second controller 135 may be set as a fourth line.

The plurality of controllers 130 may determine a power supply line, in which at least one of the winding, inverter or the controller has malfunctioned or is broken, among the plurality of power supply lines. As illustrated in FIG. 1, a plurality of sensors 141, 143, 145 and 147 may be provided on the plurality of power supply lines, respectively, to detect values of current flowing through the plurality of respective power supply lines.

According to an embodiment, the plurality of controllers 130 may determine whether or not each of the power supply lines has malfunctioned by comparing a current value detected by each of the plurality of sensors 141, 143, 145 and 147 with a steady-state current value. For example, when each of the components of the motor control apparatus 100 for a vehicle operates normally, the power supply lines may be previously set such that 25% of rated current of the motor 110 may be supplied to the motor 110 via each of the power supply lines. If a current value detected is outside of a predetermined range from a preset value, the plurality of controllers 130 may determine a power supply line, on which the current value is detected, as having malfunctioned.

Although the sensors 141, 143, 145 and 147 are illustrated as being provided between the plurality of inverters 120 and the motor 110 in FIG. 1, the present disclosure is not limited thereto. According to an example, the sensors may be provided between the plurality of inverters 120 and the plurality of controllers 130. Alternatively, according to an example, the sensors may be provided between the plurality of inverters 120 and the motor 110 and between the plurality of controllers 130 and the plurality of inverters 120.

According to an embodiment, each of the controllers may transmit a state check signal to or receive a state check signal from at least one other controller to determine whether or not the other controller has malfunctioned. Alternatively, the plurality of controllers 130 may further include a malfunction determination controller to determine whether or not each of the controllers has malfunctioned. This will be described in more detail hereinafter with reference to the relevant drawings.

The plurality of controllers 130 may control electric power that has been supplied via a power supply line determined as having malfunctioned to be supplied via another power supply line. A case in which the first inverter 121 has malfunctioned will be taken as an example. In this case, the current that has been supplied via the first line or the power supply line including the first inverter 121, equal to 25% of rated current of the motor 110, may be detected as not having been properly supplied.

The plurality of controllers 130 may determine that the first line has malfunctioned, based on a current value detected by the first sensor 141 provided on the first line. The plurality of controllers 130 may control the plurality of inverters 120 to increase amounts of current supplied via the second line, the third line and the fourth line, so that a total amount of current equal to 100% of the rate current is supplied to the motor 110. That is, the same amount of electric power as in the case of a normal operating state may be provided by boosting amounts of current supplied via the normal supply lines.

For example, the first controller 131 may control the second inverter 123 to increase the amount of current supplied via the second line from 25% of rated current to one third (about 33.33%) of rated current. In addition, the third inverter 125 and the fourth inverter 127 may be controlled to increase the amounts of current supplied via the third line and the fourth line, respectively, from 25% of rated current to one third (about 33.33%) of rated current.

In this regard, according to an example, the first controller 131 and the second controller 135 may calculate values of current to be supplied via the inverters, respectively, by transmitting signals to and receiving signals from others thereof. The first controller 131 and the second controller 135 may control the corresponding inverters, based on the calculated current values. Alternatively, according to another example, the first controller 131 and the second controller 135 may control the corresponding inverters by receiving control signals from the malfunction determination controller.

According to an example, the motor control apparatus for a vehicle may further include a power supply breaker (not shown) to cut off the supply of power to a malfunctioning line. The power supply breaker may cut off the supply of power, under the control of the plurality of controllers 130. The power supply breaker is not limited to a specific device as long as the power supply breaker can cut off the supply of power to a malfunctioning line.

Although the foregoing description has been provided with respect to the case in which the first inverter 121 has malfunctioned, a motor control method with respect to the case in which another component has malfunctioned will be described hereinafter with reference to the related drawings.

As described above, if at least one of the winding, the inverter or the controller of a single power supply line has malfunctioned, electric power that has been supplied via the malfunctioning power supply line can supplement power of another power supply line, thereby maintaining the power output of the motor at a reliable level, so that redundancy can be obtained in the operation of the motor.

Figure 2A:
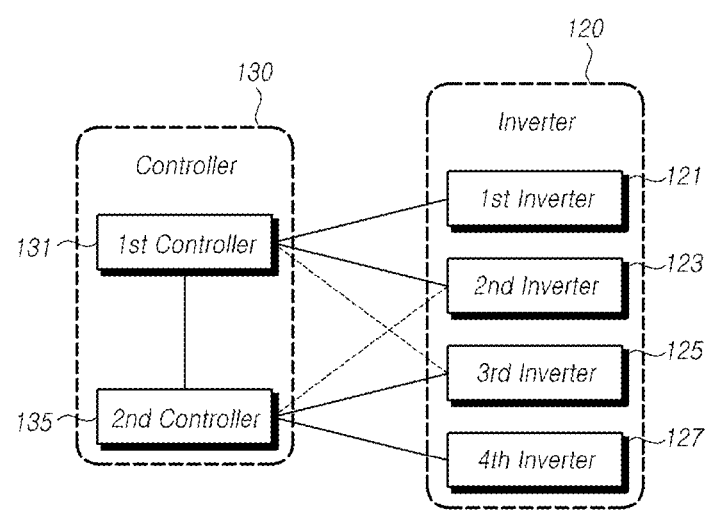
FIGS. 2A and 2B are block diagrams of the controller and the inverter of the motor control apparatus for a vehicle according to an embodiment of the present disclosure.
Figure 2B:
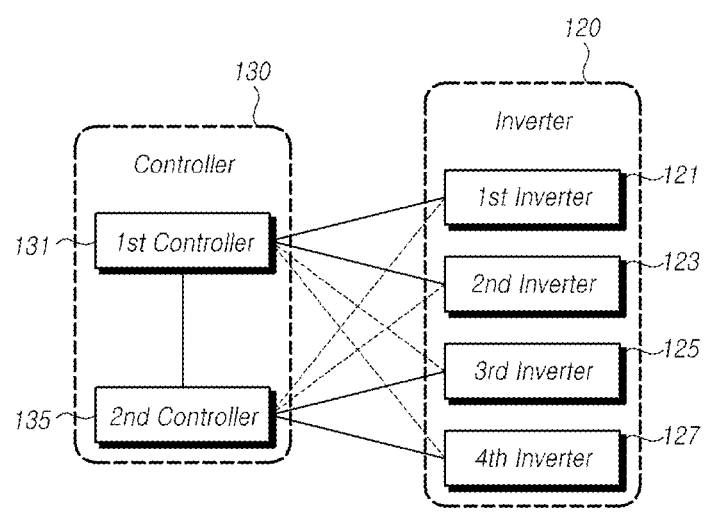

FIGS. 2A and 2B are block diagrams of the plurality of controllers and the plurality of inverters of the motor control apparatus for a vehicle according to an embodiment of the present disclosure.

According to an embodiment, each of the controllers may transmit a state check signal to and receive a state check signal from others thereof and determine whether or not the others thereof have malfunctioned, based on the state check signal. As illustrated in FIGS. 2A and 2B, the first controller 131 and the second controller 135 may be communication-connected to transmit signals to and receive signals from others thereof. A control information signal including control information regarding the inverters of the controllers, such as current values supplied via the inverters, may be transmitted and received between the controllers.

In addition, the state check signal may be transmitted and received between the controllers to determine whether or not each of the controllers has malfunctioned. According to an example, the state check signal may be separate signals respectively including operating state information of each of the controllers, and may be transmitted and received at predetermined intervals. Alternatively, the state check signal may be implemented as flag data included in the control information signal. The controllers may determine whether others thereof malfunction or not, based on the flag data, wherein each of controllers have transmitted the control information signal to each other.

Referring to FIG. 2A, according to an embodiment, each of the controllers may be connected to two inverters, among the plurality of inverters, via main connection circuits. In addition, each of the controllers may be connected to one of the two inverters via an auxiliary connection circuit. The two other inverters is connected to the other controller via the main connection circuits, wherein each of the controllers has transmitted the state check signal to and received the state check signal from the other controller. Each of the controllers may control the inverter connected via the auxiliary connection circuit in an overlapping manner, in addition to the inverters connected via the main connection circuits.

For example, referring to FIG. 2A, the first controller 131 may be connected to the first inverter 121 and the second inverter 123 via the main connection circuits (represented by solid lines). In addition, the first controller 131 may be connected to the third inverter 125, connected to the second controller 135 via the main connection circuit, via an auxiliary connection circuit (represented by a dotted line). Similarly, the second controller 135 may be connected to the second inverter 123, connected to the first controller 131 via the main connection circuit, via an auxiliary connection circuit (represented by a dotted line).

Each of the controllers may be set to control the two inverters via the main connection circuit in the normal operating state. If one of the controllers is determined as having malfunctioned, another controller that has transmitted the state check signal to and received the state check signal from the malfunctioning controller may additionally control one of the two inverters, which has been controlled by the malfunctioning controller, via the auxiliary connection circuit.

Referring to FIG. 2A, a case in which the first controller 131 is determined as having malfunctioned will be taken as an example. If the first controller 131 is determined as having malfunctioned, the second controller 135 may control the second inverter 123, among the first inverter 121 and the second inverter 123 connected to the first controller 131 via the main connection circuits, via the auxiliary connection circuit. According to an example, the auxiliary connection circuit may be disconnected in the normal operating state while being connected if the corresponding controller is determined as having malfunctioned. However, this is illustrative only, and the auxiliary connection circuit may remain connected in the normal operating state.

According to an example, in the case in which the second controller 135 is connected to the second inverter 123 via the auxiliary connection circuit, the second controller 135 may control an amount of current supplied via each of the second line, the third line and the fourth line to be equal to one third of rated current of the motor 110. Consequently, even in the case in which the first controller 131 has malfunctioned, an amount of current equal to 100% of rated current may be supplied to the motor 110.

Alternatively, referring to FIG. 2B, according to another embodiment, the first controller 131 may be connected to the first inverter 121 and the second inverter 123 via main connection circuits (represented by solid lines). In addition, the first controller 131 may be connected to the third inverter 125 and the fourth inverter 127 via auxiliary connection circuits (represented by dotted lines), the third inverter 125 and the fourth inverter 127 being connected to the second controller 135 via main connection circuits.

Each of the controllers may be set to control two inverters via the main connection circuits in the normal operating state. If one of the controllers is determined as having malfunctioned, another controller that has transmitted the state check signal to and received the state check signal from the malfunctioning controller may additionally control the two inverters, which have been controlled by the malfunctioning controller, via the auxiliary connection circuits.

Referring to FIG. 2B, a case in which the first controller 131 is determined as having malfunctioned will be taken as an example. If the first controller 131 is determined as having malfunctioned, the second controller 135 may control the first inverter 121 and the second inverter 123, connected to the first controller 131 via the main circuits, via auxiliary circuits. According to an example, the auxiliary circuits may be disconnected in the normal operating state while being connected if a malfunction is confirmed. However, this is illustrative only, and the auxiliary connection circuits may remain connected in the normal operating state.

According to an example, in a case in which the second controller 135 is connected to the first inverter 121 and the second inverter 123 via the auxiliary connection circuits, the second controller 135 may control an amount of current supplied via each of the first line, the second line, the third line and the fourth line to be equal to 25% of rated current of the motor 110. Consequently, even in the case in which the first controller 131 has malfunctioned, an amount of current equal to 100% of rated current may be supplied to the motor 110.

As described above, an inverter having been controlled by a malfunctioning controller among a plurality of controllers can be controlled by another controller, so that redundancy can be obtained in the operation of a variety of motors provided in the vehicle.

Figure 3:
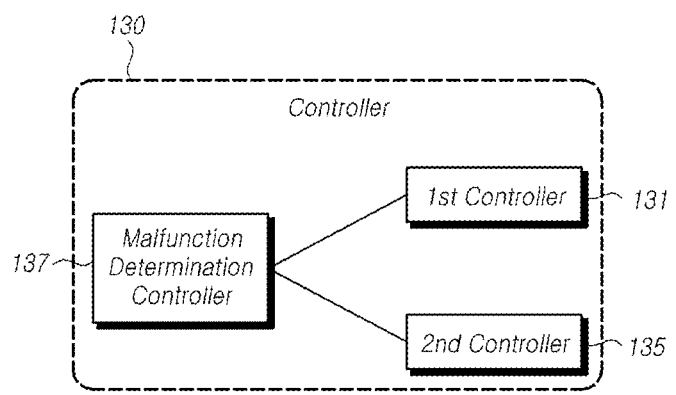
FIG. 3 is a block diagram of the controller of the motor control apparatus for a vehicle according to an embodiment of the present disclosure.

FIG. 3 is a block diagram of the plurality of controllers of the motor control apparatus for a vehicle according to an embodiment of the present disclosure.

Referring to FIG. 3, according to an embodiment, the plurality of controllers 130 may further include a malfunction determination controller 137 to determine whether or not each of a plurality of controllers has malfunctioned. According to an example, the malfunction determination controller 137 may be implemented as an MCU. The malfunction determination controller 137 may control the operation of the first controller 131 and the second controller 135. The malfunction determination controller 137 may transmit a state check signal to and receive a state check signal from the first controller 131 and the second controller 135 to determine the state of each of the first controller 131 and the second controller 135.

The malfunction determination controller 137 may determine whether or not the first controller 131 and the second controller 135 malfunction, based on the received signal. If one of the controllers is determined as having malfunctioned, the malfunction determination controller 137 may control the controllers so that electric power that has been supplied via a power transmission line including the malfunctioning controller is supplied via another power supply line.

For example, a case in which the first controller 131 is determined as having malfunctioned will be taken as an example. If the first controller 131 is determined as having malfunctioned, the malfunction determination controller 137 may control electric power that has been supplied by the first controller 131 to be additionally supplied by the second controller 135. Then, the second controller 135 may control a total amount of current supplied by the third inverter 125 and the fourth inverter 127 to be equal to 50% of rated current of the motor 110. Accordingly, even in the case in which the first controller 131 has malfunctioned, an amount of current equal to 100% of rated current may be supplied to the motor 110.

According to an example, the malfunction determination controller 137 may be set to control the overall operation of any system of a vehicle in which the motor 110 is used, in addition to determining whether or not any one of the controllers has malfunctioned. For example, in the case of the steering system, the malfunction determination controller 137 may calculate an amount of driving force to be output by the steering system, and based on a result of the calculation, control the operation of the first controller 131 and the second controller 135.

As described above, a higher-level controller may further be provided to determine whether or not each of the plurality of controllers has malfunctioned and to control electric power that has been supplied by a controller determined as having malfunctioned to be additionally supplied by another controller, so that redundancy can be obtained in the operation of motors included in a variety of systems provided in a vehicle.

Figure 4:
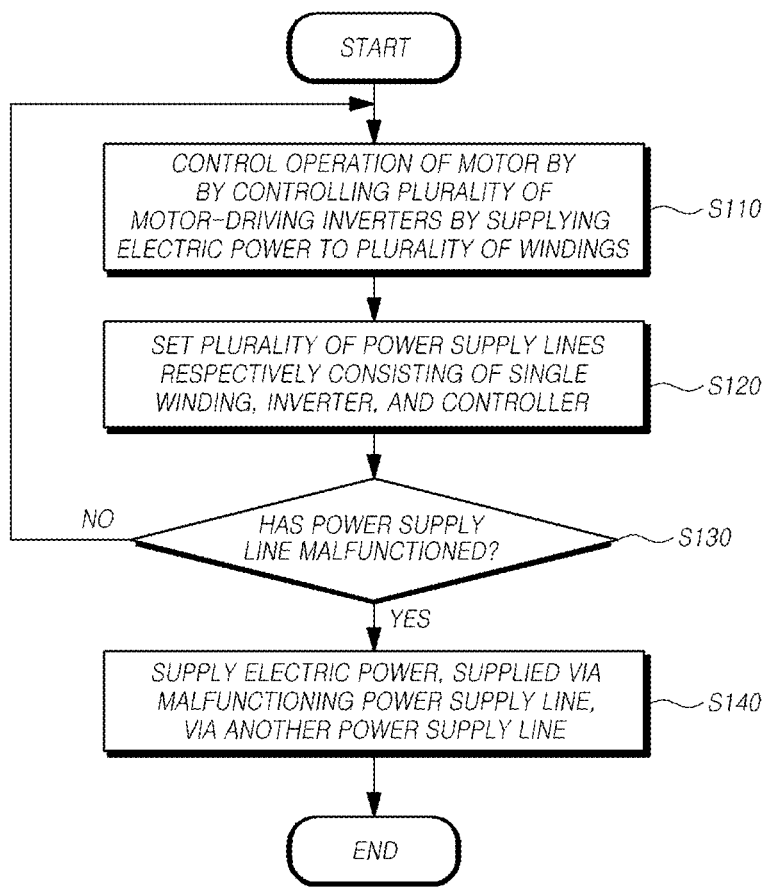
FIG. 4 is a flowchart illustrating a motor control method for a vehicle according to the present disclosure.
Figure 5:
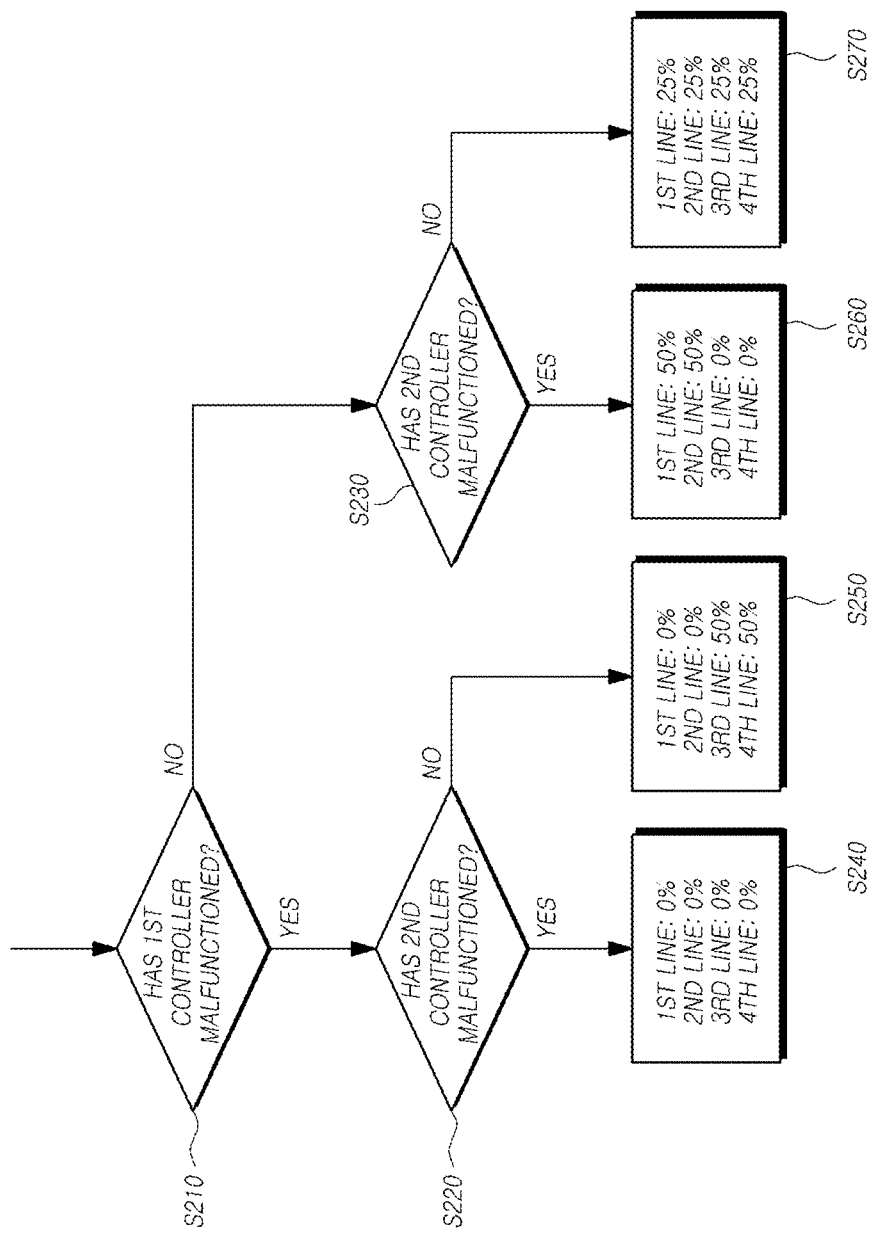
FIG. 5 is a flowchart illustrating a power supply method in a case in which the controller of the motor control apparatus for a vehicle according to the present disclosure has malfunctioned.
Figure 6:
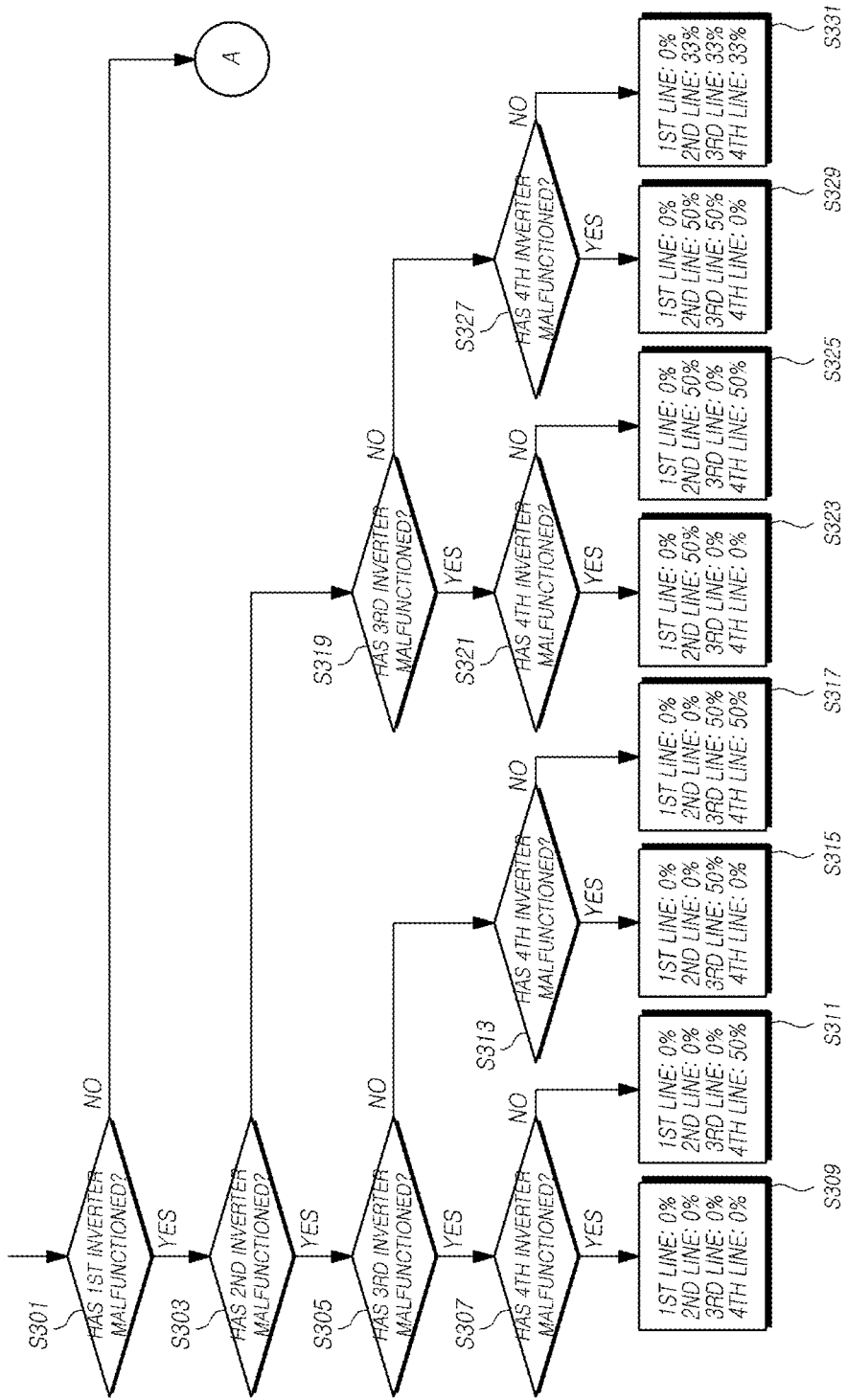
FIGS. 6 and 7 are flowcharts illustrating the power supply method in a case in which the inverter of the motor control apparatus for a vehicle according to the present disclosure has malfunctioned.
Figure 7:
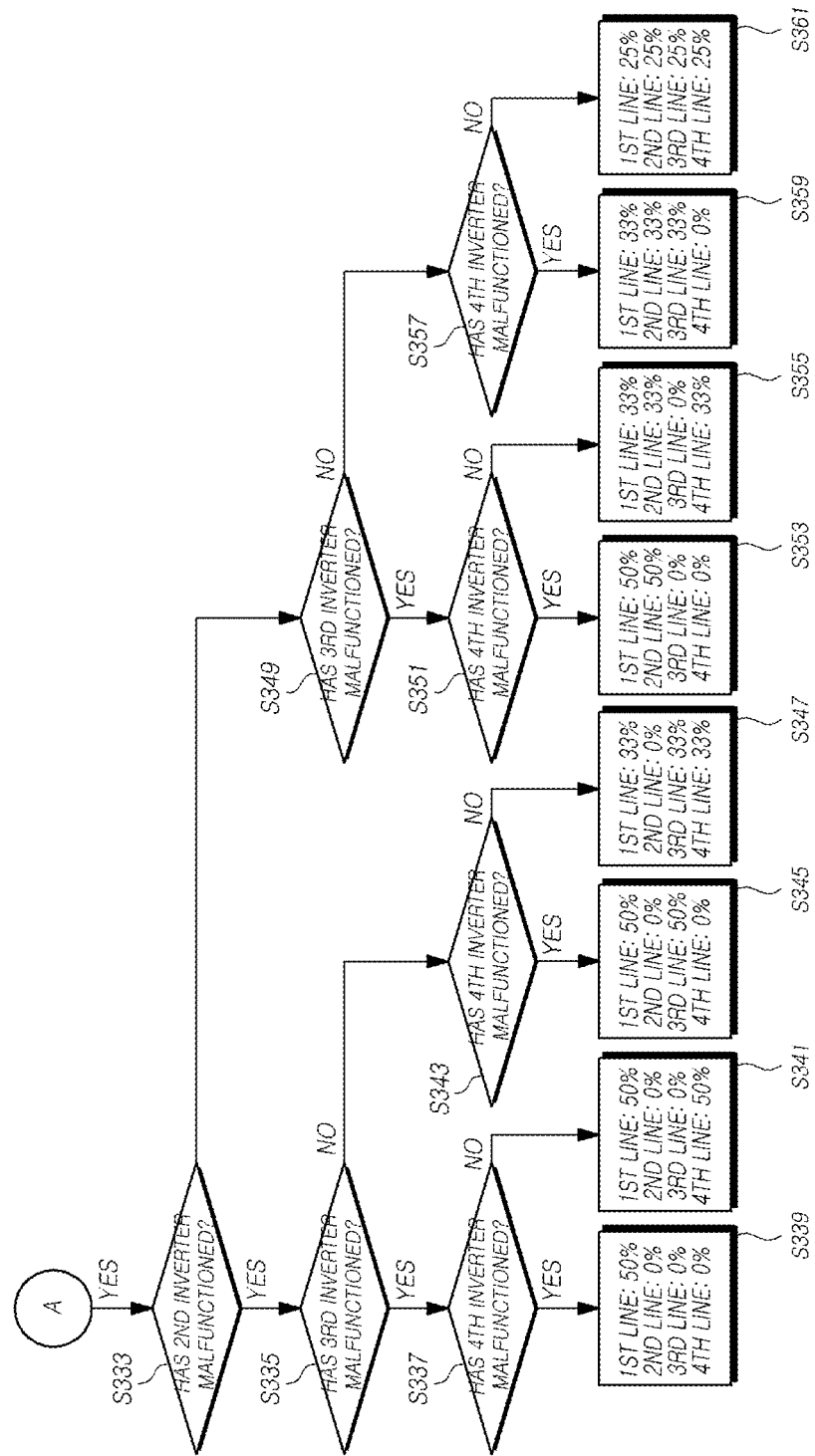
Figure 8:
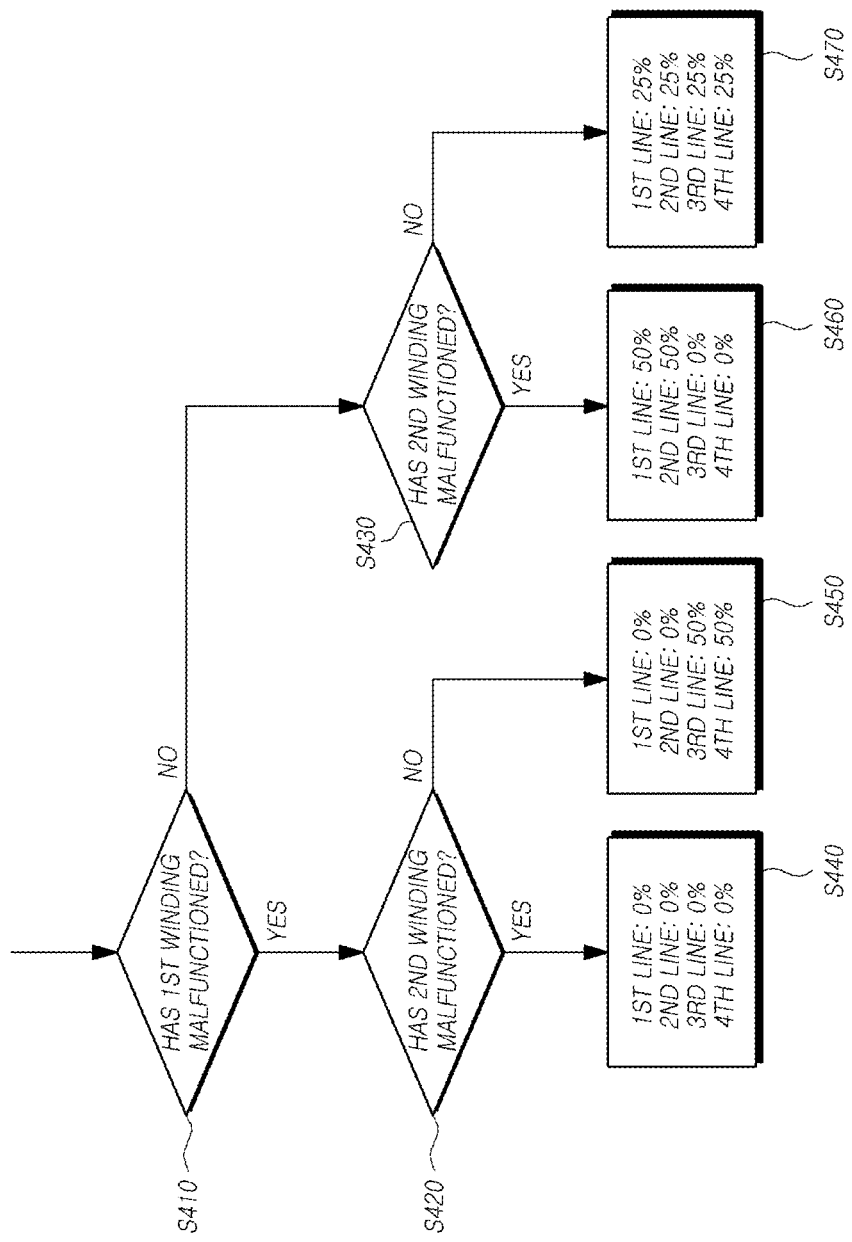
FIG. 8 is a flowchart illustrating the power supply method in a case in which the winding of the motor of the motor control apparatus for a vehicle according to the present disclosure has malfunctioned.

FIG. 4 is a flowchart illustrating a motor control method for a vehicle according to the present disclosure. FIG. 5 is a flowchart illustrating a power supply method in a case in which the controller of the motor control apparatus for a vehicle according to the present disclosure has malfunctioned. FIGS. 6 and 7 are flowcharts illustrating the power supply method in a case in which the inverter of the motor control apparatus for a vehicle according to the present disclosure has malfunctioned. FIG. 8 is a flowchart illustrating the power supply method in a case in which the winding of the motor of the motor control apparatus for a vehicle according to the present disclosure has malfunctioned.

The motor control method for a vehicle according to the present disclosure may be realized with the motor control apparatus 100 for a vehicle described above with reference to FIG. 1. Hereinafter, the motor control method for a vehicle according to the present disclosure and the operation of the motor control apparatus 100 for a vehicle for realizing the motor control method will be described in detail with reference to the relevant drawings.

Referring to FIG. 4, in S110, the plurality of controllers 130 may control the plurality of inverters, which drive the motor by supplying electric power to one of the plurality of windings, using the plurality of controllers.

The plurality of controllers 130 may include the plurality of controllers. The plurality of controllers 130 according to an embodiment of the present disclosure may include two controllers. Each of the controllers may control a plurality of inverters. For example, as illustrated in FIG. 1, the first controller 131 may control the first inverter 121 and the second inverter 123. In addition, the second controller 135 may control the third inverter 125 and the fourth inverter 127.

The plurality of controllers 130 may control the plurality of inverters 120 to generate electric current by converting a DC voltage into an AC voltage and to provide the generated electric current to one winding among the plurality of windings of the motor. For example, in the case of the steering system, the plurality of controllers 130 may calculate an amount of power necessary in response to the driver performing a steering operation and control the plurality of inverters 120 to drive the motor 110 using the calculated amount of power.

Referring to FIG. 1, the first inverter 121 and the second inverter 123 may supply current to the first winding 111 of the motor 110. In addition, the third inverter 125 and the fourth inverter 127 may supply current to the second winding 115 of the motor 110.

In this case, the plurality of controllers 130 may control each of the four inverters 121, 123, 125 and 127 to provide 25% of rated current of the motor 110. The two controllers 131 and 135 of the plurality of controllers 130 may control the four inverters 121, 123, 125 and 127 so that each of the four inverters 121, 123, 125 and 127 provides 25% of rated current of the motor 110. However, this is illustrative only, and the present disclosure is not limited thereto. As long as a total amount of current supplied by the plurality of inverters 120 is 100% of rated current, the plurality of controllers 130 may differently control the current supplied by each of the inverters as required.

Returning to FIG. 4, in S120, the plurality of controllers 130 may set the plurality of windings, the plurality of inverters and the plurality of controllers as a plurality of power supply lines, each of which consists of a single winding, a single inverter and a single controller.

According to an embodiment of the present disclosure, the plurality of windings, the plurality of inverters and the plurality of controllers may be set as the plurality of power supply lines, each of which consists of a single winding, a single inverter and a single controller. For example, the first winding 111, the first inverter 121 and the first controller 131 may be set as a first line. Similarly, the first winding 111, the second inverter 123 and the first controller 131 may be set as a second line. In addition, the second winding 115, the third inverter 125 and the second controller 135 may be set as a third line. In addition, the second winding 115, the fourth inverter 127 and the second controller 135 may be set as a fourth line.

Returning to FIG. 4, in S130, the plurality of controllers 130 may determine a power supply line, in which at least one of the winding, inverter or the controller has malfunctioned, among the plurality of power supply lines.

According to an embodiment, the plurality of controllers 130 may determine whether or not each of the power supply lines has malfunctioned by comparing a current value detected by each the power supply lines with a preset steady-state current value. For example, when each of the components of the motor control apparatus 100 for a vehicle operates normally, the power supply lines may be previously set such that 25% of rated current of the motor 110 may be supplied to the motor 110 via each of the power supply lines. If a current value detected is outside of a predetermined range from a preset value, the plurality of controllers 130 may determine a power supply line, on which the current value is detected, as having malfunctioned.

According to an embodiment, each of the controllers of the plurality of controllers 130 may transmit a state check signal to or receive a state check signal from at least one other controller to determine whether or not the other controller has malfunctioned. Each of the controllers may determine whether or not the other controller has malfunctioned based on the state check signal. Alternatively, the plurality of controllers 130 may further include a malfunction determination controller to determine whether or not each of the controllers has malfunctioned. The malfunction determination controller may determine whether or not each of the controllers has malfunctioned, based on signals received from the controllers.

Returning to FIG. 4, in S140, the plurality of controllers 130 may control electric power that has been supplied via a power supply line determined as having malfunctioned to supplement power of another power supply line.

The plurality of controllers 130 may control electric power that has been supplied via the power supply line determined as having malfunctioned to be supplied via another power supply line. A case in which the first inverter 121 has malfunctioned will be taken as an example. In this case, the current that has been supplied via the first line or the power supply line including the first inverter 121, equal to 25% of rated current of the motor 110, may be not properly supplied. The plurality of controllers 130 may control the plurality of inverters 120 to increase amounts of current supplied via the second line, the third line and the third line, so that a total amount of current equal to 100% of rated current of the motor 110 is supplied to the motor 110.

Hereinafter, the motor control method for a vehicle will be described, depending on whether or not each of the components of the vehicle motor has malfunctioned, regarding a case in which the motor control apparatus for a vehicle illustrated in FIG. 1 is used.

Referring to FIG. 5, the motor control method for a vehicle in a case in which the controllers of the plurality of controllers 130 malfunction is illustrated. In S210, the plurality of controllers 130 may determine whether or not the first controller has malfunctioned. If the first controller is determined as having malfunctioned (YES in S210), electric power cannot be supplied to either the first line or the second line, in which the first controller is included.

In this case, in S220, the plurality of controllers 130 may determine whether or not the second controller has malfunctioned. If the second controller is determined as having malfunctioned (YES in S220), electric power cannot be supplied to either the third line or the fourth line, in which the second controller is included. Consequently, in S240, a total amount of current supplied to the four power supply lines may be 0%. In this case, an additional process may be provided, with a detailed description thereof being omitted.

If the second controller is determined as not having malfunctioned (NO in S210), electric power may be supplied to the third line and the fourth line, in each of which the second controller is included. Then, the plurality of controllers 130 may control electric power that has been additionally supplied by the first controller to be supplied by the second controller. Accordingly, in S250, 50% of rated current of the motor may be provided via each of the third line and the fourth line.

If the first controller is determined as not having malfunctioned (NO in S210), electric power may be supplied to the first line and the second line in each of which the first controller is included. In this case, in S230, the plurality of controllers 130 may determine whether or not the second controller has malfunctioned. If the second controller is determined as having malfunctioned (YES in S230), electric power cannot be supplied to either the third line or the fourth line, in which the second controller is included. Then, the plurality of controllers 130 may control electric power that has been supplied by the second controller to be additionally supplied by the first controller. Accordingly, in S260, 50% of rated current of the motor may be provided via each of the first line and the second line.

If the second controller is also determined as not having malfunctioned (NO in S230), electric power may be supplied via all of the first line, the second line, the third line and the fourth line. This indicates a normal operating state and in S270, the plurality of controllers 130 may control 25% of rated current of the motor to be supplied via each of the lines.

Referring to FIG. 6, the power supply method in a case in which one or more inverters of the plurality of inverters 120 malfunction is illustrated. In S301, the plurality of controllers 130 may determine whether or not the first inverter has malfunctioned. If the first inverter is determined as having malfunctioned (YES in S301), electric power cannot be supplied to the first line in which the first inverter is included.

In this case, in S303, the plurality of controllers 130 may determine whether or not the second inverter has malfunctioned. If the second inverter is determined as having malfunctioned (YES in S303), electric power cannot be supplied to the second line in which the second inverter is included. In this case, in S305, the plurality of controllers 130 may determine whether or not the third inverter has malfunctioned. If the third inverter is determined as having malfunctioned (YES in S305), electric power cannot be supplied to the third line in which the third inverter is included. In this case, in S307, the plurality of controllers 130 may determine whether or not the fourth inverter has malfunctioned. If the fourth inverter is determined as having malfunctioned (YES in S307), electric power cannot be supplied to the fourth line in which the fourth inverter is included.

Consequently, in a case in which all of the first inverter, the second inverter, the third inverter and the fourth inverter malfunction, in S309, a total amount of current supplied to the four power supply lines may be 0%. In this case, an additional process may be provided, with a detailed description thereof being omitted.

Returning to step S307, if the fourth inverter is determined as not having malfunctioned (NO in S307), electric power may be supplied to the fourth line in which the fourth inverter is included. Consequently, the plurality of controllers 130 may control the fourth inverter to supply a maximum value of current that the fourth inverter can supply, so that electric power can be additionally supplied via the fourth line. Accordingly, in S311, 50% of rated current of the motor may be supplied via the fourth line.

Returning to step S305, if the third inverter is determined as not having malfunctioned (NO in S305), electric power may be supplied to the third line in which the third inverter is included. In this case, in S313, the plurality of controllers 130 may determine whether or not the fourth inverter has malfunctioned. If the fourth inverter is determined as having malfunctioned (YES in S313), electric power cannot be supplied to the fourth line in which the fourth inverter is included. Then, the plurality of controllers 130 may control the third inverter to supply a maximum value of current that the third inverter can supply, so that electric power can be additionally supplied via the third line. Accordingly, in S315, 50% of rated current of the motor may be supplied via the third line.

Returning to step S313, if the fourth inverter is determined as not having malfunctioned (NO in S313), electric power may be supplied to the fourth line in which the fourth inverter is included. Then, the plurality of controllers 130 may control the third inverter and the fourth inverter so that electric power can be additionally supplied via the third line and the fourth line. Accordingly, in S317, 50% of rated current of the motor may be supplied via each of the third line and the fourth line.

Returning to step S303, if the second inverter is determined as not having malfunctioned (NO in S303), electric power may be supplied to the second line in which the second inverter is included.

In this case, in S319, the plurality of controllers 130 may determine whether or not the third inverter has malfunctioned. If the third inverter is determined as having malfunctioned (YES in S319), electric power cannot be supplied to the third line in which the third inverter is included. In this case, in S321, the plurality of controllers 130 may determine whether or not the fourth inverter has malfunctioned. If the fourth inverter is determined as having malfunctioned (YES in S321), electric power cannot be supplied to the fourth line in which the fourth inverter is included.

Since the first inverter, the third inverter and the fourth inverter malfunction in this case, the plurality of controllers 130 may control the second inverter to supply a maximum value of current that the second inverter can supply, so that electric power can be additionally supplied via the second line. Accordingly, in S323, 50% of rated current of the motor may be supplied via the second line.

Returning to step S321, if the fourth inverter is determined as not having malfunctioned (NO in S321), electric power may be supplied to the fourth line in which the fourth inverter is included. Then, the plurality of controllers 130 may control the second inverter and the fourth inverter to supply maximum values of current that the second inverter and the fourth inverter can supply, so that electric power can be additionally supplied via the second line and the fourth line. Accordingly, in S325, 50% of rated current of the motor may be supplied via each of the second line and the fourth line.

Returning to step S319, if the third inverter is determined as not having malfunctioned (NO in S319), electric power may be supplied to the third line in which the third inverter is included. In this case, in S327, the plurality of controllers 130 may determine whether or not the fourth inverter has malfunctioned. If the fourth inverter is determined as having malfunctioned (YES in S327), electric power cannot be supplied to the fourth line in which the fourth inverter is included. Then, the plurality of controllers 130 may control the second inverter and the third inverter to supply maximum values of current that the second inverter and the third inverter can supply, so that electric power can be additionally supplied via the second line and the third line. Accordingly, in S329, 50% of rated current of the motor may be supplied via each of the second line and the third line.

Returning to step S327, if the fourth inverter is determined as not having malfunctioned (NO in S327), electric power may be supplied to the fourth line in which the fourth inverter is included. Then, the plurality of controllers 130 may control the second inverter and the fourth inverter to supply maximum values of current that the second inverter, the third inverter and the fourth inverter can supply, so that electric power can be additionally supplied via the second line, the third line and the fourth line. Accordingly, in S331, one third of rated current of the motor may be supplied via each of the second line, the third line and the fourth line.

Returning to step S301, if the first inverter is determined as not having malfunctioned (NO in S301), electric power may be supplied to the first line in which the first inverter is included. The subsequent steps are illustrated in FIG. 7. Referring to FIG. 7, in S333, the plurality of controllers 130 may determine whether or not the second inverter has malfunctioned. If the second inverter is determined as having malfunctioned (YES in S333), electric power cannot be supplied to the second line in which the second inverter is included. In this case, in S335, the plurality of controllers 130 may determine whether or not the third inverter has malfunctioned. If the third inverter is determined as having malfunctioned (YES in S335), electric power cannot be supplied to the third line in which the third inverter is included. In this case, in S337, the plurality of controllers 130 may determine whether or not the fourth inverter has malfunctioned. If the fourth inverter is determined as having malfunctioned (YES in S337), electric power cannot be supplied to the fourth line in which the fourth inverter is included.

Then, the plurality of controllers 130 may control the first inverter to supply a maximum value of current that the first inverter can supply, so that electric power can be additionally supplied via the first line. Accordingly, in S339, 50% of rated current of the motor may be supplied via the first line.

Returning to step S337, if the fourth inverter is determined as not having malfunctioned (NO in S337), electric power may be supplied to the fourth line in which the fourth inverter is included. Then, the plurality of controllers 130 may control the first inverter and the fourth inverter to supply maximum values of current that the first inverter and the fourth inverter can supply, so that electric power can be additionally supplied via the first line and the fourth line. Accordingly, in S341, 50% of rated current of the motor may be supplied via each of the first line and the fourth line.

Returning to step S335, if the third inverter is determined as not having malfunctioned (NO in S335), electric power may be supplied to the third line in which the third inverter is included. In this case, in S343, the plurality of controllers 130 may determine whether or not the fourth inverter has malfunctioned. If the fourth inverter is determined as having malfunctioned (YES in S343), electric power cannot be supplied to the fourth line in which the fourth inverter is included. Then, the plurality of controllers 130 may control the first inverter and the third inverter to supply maximum values of current that the first inverter and the third inverter can supply, so that electric power can be additionally supplied via the first line and the third line. Accordingly, in S345, 50% of rated current of the motor may be supplied via each of the first line and the third line.

Returning to step S343, if the fourth inverter is determined as not having malfunctioned (NO in S343), electric power may be supplied to the fourth line in which the fourth inverter is included. Then, the plurality of controllers 130 may control the second inverter and the fourth inverter to supply maximum values of current that the first inverter, the third inverter and the fourth inverter can supply, so that electric power can be additionally supplied via the first line, the third line and the fourth line. Accordingly, in S347, one third of rated current of the motor may be supplied via each of the first line, the third line and the fourth line.

Returning to step S333, if the second inverter is determined as not having malfunctioned (NO in S333), electric power may be supplied to the second line in which the second inverter is included. In this case, in S349, the plurality of controllers 130 may determine whether or not the third inverter has malfunctioned. If the third inverter is determined as having malfunctioned (YES in S349), electric power cannot be supplied to the third line in which the third inverter is included. In this case, in S351, the plurality of controllers 130 may determine whether or not the fourth inverter has malfunctioned. If the fourth inverter is determined as having malfunctioned (YES in S351), electric power cannot be supplied to the fourth line in which the fourth inverter is included.

Since the third inverter and the fourth inverter malfunction in this case, the plurality of controllers 130 may control the first inverter and the second inverter to supply maximum values of current that the first inverter and the second inverter can supply, so that electric power can be additionally supplied via the first line and the second line. Accordingly, in S353, 50% of rated current of the motor may be supplied via each of the first line and the second line.

Returning to step S351, if the fourth inverter is determined as not having malfunctioned (NO in S351), electric power may be supplied to the fourth line in which the fourth inverter is included. Then, the plurality of controllers 130 may control the first inverter, the second inverter and the fourth inverter to supply maximum values of current that the first inverter, the second inverter and the fourth inverter can supply, so that electric power can be additionally supplied via the first line, the second line and the fourth line. Accordingly, in S355, one third of rated current of the motor may be supplied via each of the first line, the second line and the fourth line.

Returning to step S349, if the third inverter is determined as not having malfunctioned (NO in S349), electric power may be supplied to the third line in which the third inverter is included. In this case, in S357, the plurality of controllers 130 may determine whether or not the fourth inverter has malfunctioned. If the fourth inverter is determined as having malfunctioned (YES in S357), electric power cannot be supplied to the fourth line in which the fourth inverter is included. Then, the plurality of controllers 130 may control the first inverter, the second inverter and the third inverter so that electric power can be additionally supplied via the first line, the second line and the third line. Accordingly, in S359, one third of rated current of the motor may be supplied via each of the first line, the second line and the third line.

Returning to step S357, if the fourth inverter is determined as not having malfunctioned (NO in S357), electric power may be supplied to the fourth line in which the fourth inverter is included. Consequently, electric power may be supplied via all of the first line, the second line, the third line and the fourth line. This indicates a normal operating state, and in S361, the plurality of controllers 130 may control 25% of rated current of the motor to be respectively supplied via all of the lines.

Referring to FIG. 8, the motor control method for a vehicle in a case in which one or more windings 110 malfunction is illustrated. In S410, the plurality of controllers 130 may determine whether or not the first winding has malfunctioned. If the first winding is determined as having malfunctioned (YES in S410), electric power cannot be supplied to either the first line or the second line, in which the first winding is included.

In this case, in S420, the plurality of controllers 130 may determine whether or not the second winding has malfunctioned. If the second winding is determined as having malfunctioned (YES in S420), electric power cannot be supplied to either the third line or the fourth line, in which the second winding is included. Consequently, a total amount of current supplied to the four power supply lines may be 0%. In this case, an additional process may be provided, with a detailed description thereof being omitted.

If the second winding is determined as not having malfunctioned (NO in S420), electric power can be supplied to the third line and the fourth line in each of which the second winding is included. Then, the plurality of controllers 130 may control electric power that has been supplied to the first winding to be supplied via the second winding. Accordingly, in S450, 50% of the rated current of the motor may be supplied via each of the third line and the fourth line.

Returning to step S410, if the first winding is determined as not having malfunctioned (NO in S410), electric power can be supplied to the first line and the second line in each of which the first winding is included. In this case, in S430, the plurality of controllers 130 may determine whether or not the second winding has malfunctioned. If the second winding is determined as having malfunctioned (YES in S430), electric power cannot be supplied to either the third line or the fourth line, in which the second winding is included. Then, the plurality of controllers 130 may control electric power that has being supplied to the second winding to be supplied via the first winding. Accordingly, in S460, 50% of the rated current of the motor may be supplied via each of the first line and the second line.

If the second winding is also determined as not having malfunctioned (NO in S420), electric power can be supplied via all of the first line, the second line, the third line and the fourth line. This indicates a normal operating state, and in S470, the plurality of controllers 130 may control 25% of rated current of the motor to be supplied via each of the lines.

Cases in each of which the controller, the inverters or the winding has malfunctioned have been described above with reference to FIGS. 5 to 8. If two or more configurations malfunction in some circumstances, operations of determining the corresponding configurations may be performed simultaneously.

For example, a case in which the second controller has malfunctioned and the first inverter has malfunctioned will be taken. Since the malfunctioning second controller corresponds to step S260 in FIG. 5, current cannot be supplied either via the third line or the fourth line. In addition, since the malfunctioning first inverter corresponds to step S331 in FIG. 6, current cannot be supplied via the first line. When the two circumstances are combined, no current can be supplied via the first line, the third line or the fourth line. Accordingly, the first controller may control the second inverter to supply a maximum amount of current (i.e. 50% of rated current) that can be supplied via the second line.

This case is illustrative, and determination operations may be applied in substantially the same manner in a case in which two or more configurations of the motor control apparatus for a vehicle malfunction.

As described above, if at least one of the winding, inverters or the controller of a single power supply line has malfunctioned, electric power that has been supplied via the malfunctioning power supply line may be supplied via another power supply line to maintain the power output of the motor at a reliable level, so that redundancy can be obtained in the operation of the motor.

Hereinabove, the motor control method has been described, depending on whether or not each of the components has malfunctioned, regarding a case in which the motor control apparatus for a vehicle illustrated in FIG. 1 is used. Hereinafter, malfunction determination methods according to embodiments related to FIGS. 1 to 3 will be described in detail.

Figure 9:
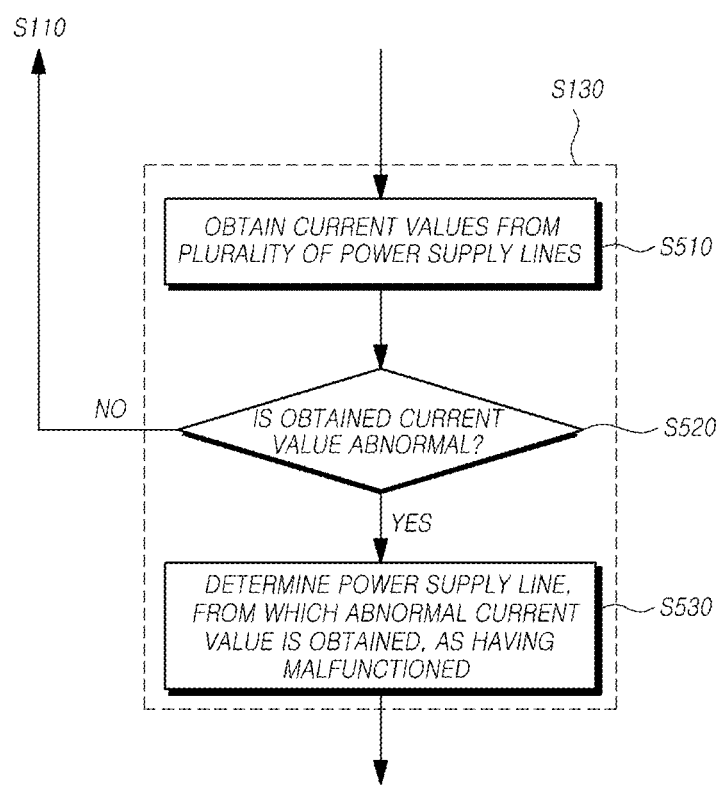
FIG. 9 is a flowchart illustrating a method of determining a malfunction, based on current values detected from the power supply lines, according to the present disclosure.

FIG. 9 is a flowchart illustrating a method of determining a malfunction, based on current values detected from the power supply lines, according to the present disclosure. The method of determining a malfunction of the motor control apparatus for a vehicle, illustrated in FIG. 9, may be realized by the motor control apparatus 100 for a vehicle, described above with reference to FIG. 1.

FIG. 9 is an embodiment of step S130 of determining whether or not a power supply line has malfunctioned, described above with reference to FIG. 4. Referring to FIG. 9, in S510, the plurality of controllers 130 may obtain a current value from each of the plurality of power supply lines. As illustrated in FIG. 1, the plurality of sensors 141, 143, 145 and 147 may be provided on the plurality of power supply lines, respectively, to detect values of current flowing through the plurality of respective power supply lines. The plurality of controllers 130 may obtain current values detected by the plurality of sensors 141, 143, 145 and 147.

Returning to FIG. 9, in S520, the plurality of controllers 130 may determine whether or not an obtained current value is normal. The plurality of controllers 130 may determine whether or not the obtained current value is normal by comparing the obtained current value with a present current value in the normal operating state. For example, the motor control apparatus 100 for a vehicle may be preset such that 25% of rated current of the motor 110 is supplied to the motor 110 via each of the power supply lines in a case in which each of the components of the motor control apparatus 100 for a vehicle operates normally. If the detected current value is outside of a predetermined range from a preset value, the plurality of controllers 130 may determine that the corresponding current value is abnormal.

If all of the current values obtained from the plurality of power supply lines are determined as being normal (NO in S520), the plurality of controllers 130 may return to step S110 illustrated in FIG. 4.

Returning to FIG. 9, if at least one of the current values obtained from the plurality of power supply lines is determined as being abnormal (YES in S520), in S530, the plurality of controllers 130 may determine the power supply line, from which the abnormal current value is obtained, as having malfunctioned. That is, the plurality of controllers 130 may determine a power supply line, from which a current value determined as being abnormal is detected, as having malfunctioned.

As described above, a malfunctioning power supply line can be easily determined based on current values detected by the sensors provided on the power supply lines and an insufficient portion of electric power can be additionally supplied via another power supply line, so that redundancy can be obtained in the operation of the motor.

Figure 10:
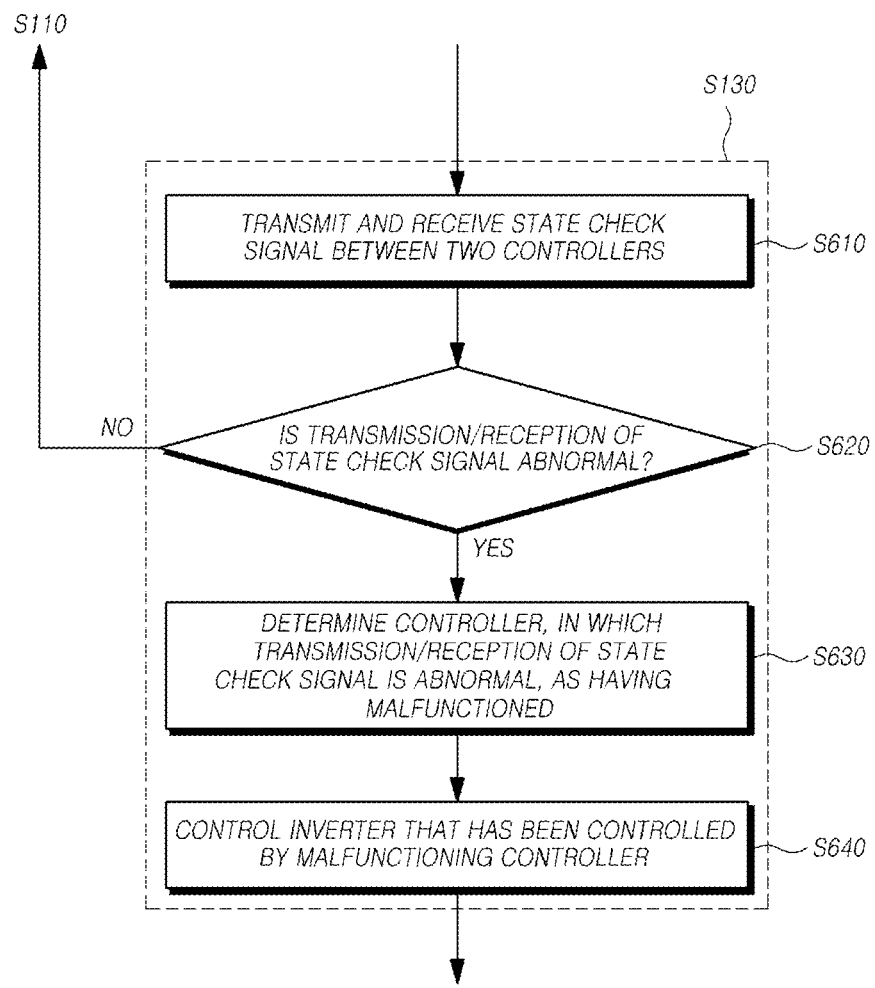
FIG. 10 is a flowchart illustrating the method of determining a malfunction, based on a result of transmitting a state check signal and receiving a state check signal, according to the present disclosure.

FIG. 10 is a flowchart illustrating the method of determining a malfunction, based on a result of transmitting a state check signal and receiving a state check signal, according to the present disclosure. The method of determining a malfunction illustrated in FIG. 10 may be realized with the motor control apparatus 100 for a vehicle, described above with reference to FIGS. 1 and 2B.

FIG. 10 is another embodiment of step S130 of determining whether or not a power supply line has malfunctioned, described above with reference to FIG. 4. Referring to FIG. 10, in S610, the state check signal may be transmitted and received between the controllers of the plurality of controllers 130. As illustrated in FIG. 2B, the first controller 131 and the second controller 135 may be communication-connected to transmit signals to and receive signals from others thereof. A control information signal including control information regarding the inverters of the controllers, such as current values supplied via the inverters, may be transmitted and received between the controllers.

In addition, the state check signal may be transmitted and received between the controllers to determine whether or not each of the controllers has malfunctioned. According to an example, the state check signal may be separate signals, respectively including operating state information of each of the controllers, and may be transmitted and received at predetermined intervals. Alternatively, the state check signal may be implemented as flag data included in the control information signal.

Returning to FIG. 10, in S620, each of the controllers of the plurality of controllers 130 may determine whether or not transmission and reception of the state check signal is abnormal. Each of the controllers may determine whether or not the state check signal including operating state information of another controller is normally received. In addition, each of the controllers may determine whether or not operating state information included in the state check signal indicates a normal operating state. In addition, each of the controllers may determine whether or not a flag data value includes an error.

If the state check signal is normally transmitted and received between the controllers (NO in S620), the plurality of controllers 130 may return to step S110 illustrated in FIG. 4.

Returning to FIG. 10, if the transmission and reception of the state check signal is abnormal in at least one of the two controllers (YES in S620), in S630, each of the controllers of the plurality of controllers 130 may determine the controller, in which the transmission and reception of the state check signal is abnormal, as having malfunctioned. If the state check signal is not normally received, each of the controllers may determine that the other controller has malfunctioned. In addition, if the received state check signal includes malfunction state information, each of the controllers may determine that the other controller has malfunctioned. In addition, if the flag data has an error, each of the controllers may determine that the other controller has malfunctioned.

Returning to FIG. 10, in S640, each of the controllers of the plurality of controllers 130 may control the inverters that have been controlled by the malfunctioning controller. According to an embodiment, each of the controllers may be connected two inverters among the plurality of inverters via the main connection circuits, respectively. In addition, each of the controllers may be connected to one of the two inverters, connected to the other controller via the main connection circuits, via an auxiliary connection circuit, wherein each of the controllers has transmitted the state check signal and received the state check signal to the other controller.

Each of the controllers may be set to control the two inverters via the main connection circuit in the normal operating state. According to an example, the auxiliary connection circuit may be disconnected in the normal operating state. Another controller that has transmitted the state check signal to and received the state check signal from the malfunctioning controller may additionally be connected to and control one of the two inverters, which has been controlled by the malfunctioning controller, via the auxiliary connection circuit.

As described above, it is possible to determine whether or not each of the controllers has malfunctioned, based on signals transmitted between the controllers, to additionally supply an insufficient amount of electric power via the power supply line controlled by the controller in the normal operating state, so that redundancy can be obtained in the operation of the motor.

Figure 11:
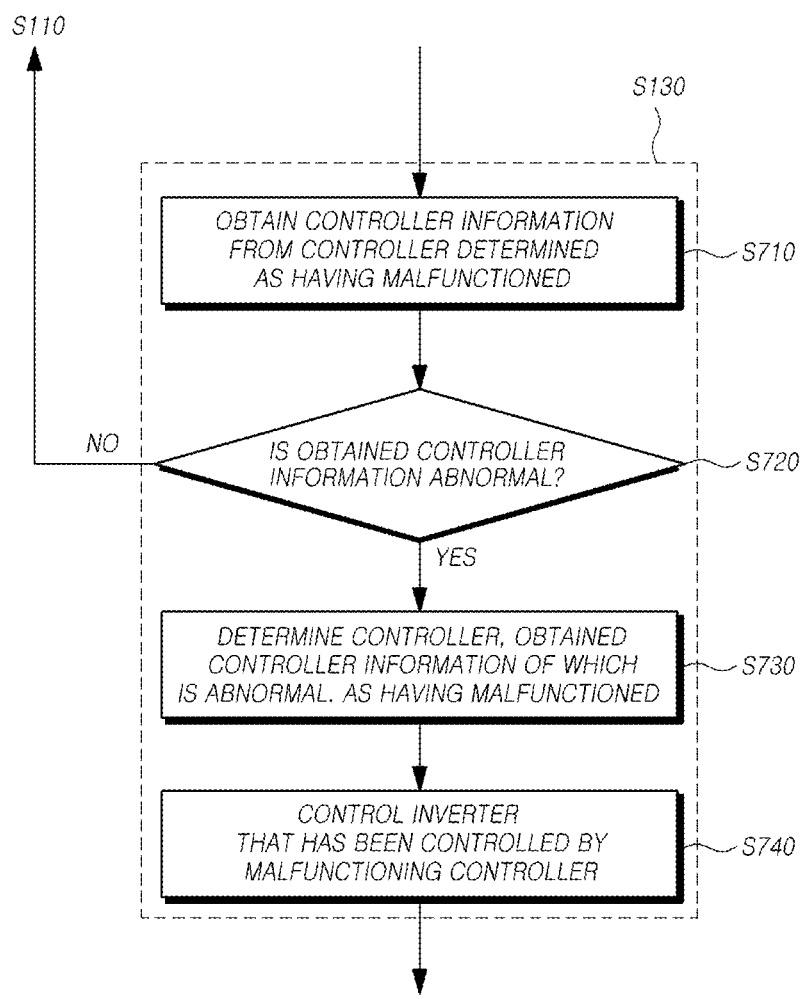
FIG. 11 is a flowchart illustrating the method of determining a malfunction, based on obtained controller information, according to the present disclosure.

FIG. 11 is a flowchart illustrating the method of determining a malfunction, based on obtained controller information, according to the present disclosure. The method of determining a malfunction illustrated in FIG. 11 may be realized with the motor control apparatus 100 for a vehicle, described above with reference to FIGS. 1 and 3.

FIG. 11 is further another embodiment of step S130 of determining whether or not there is a malfunctioning power supply line, described above with reference to FIG. 4. Referring to FIG. 11, in S710, the malfunction determination controller of the plurality of controllers 130 may obtain information regarding the controllers. As illustrated in FIG. 3, the plurality of controllers 130 may further include a malfunction determination controller 137 to determine whether or not each of a plurality of controllers has malfunctioned. The malfunction determination controller 137 may transmit a state check signal to and receive a state check signal from the first controller 131 and the second controller 135 to determine the state of each of the first controller 131 and the second controller 135.

Returning to FIG. 11, in S720, the malfunction determination controller may determine whether or not obtained information regarding each of the controllers is abnormal. The malfunction determination controller may determine whether or not information regarding each of the controllers is being normally received from each of the controllers. In addition, the malfunction determination controller may determine whether or not received information regarding each of the controllers indicates a normal operating state.

If all of pieces of information regarding the plurality of controllers are determined as being normal (NO in S720), the plurality of controllers 130 may return to step S110 illustrated in FIG. 4. Returning to FIG. 11, if information regarding at least one controller of the plurality of controllers is determined as being abnormal (YES in S720), in S730, the malfunction determination controller may determine that the controller, from which abnormal information is obtained, as having malfunctioned. If information regarding any controller is not normally received, the malfunction determination controller may determine that the corresponding controller has malfunctioned. In addition, if received information regarding any controller indicates a malfunction, the malfunction determination controller may determine that the corresponding controller has malfunctioned.

As described above, a higher-level controller may further be provided to determine whether or not each of the plurality of controllers has malfunctioned and to control electric power that has been supplied by the malfunctioning controller to be supplied via another controller, so that redundancy can be obtained in the operation of motors included in a variety of systems provided in a vehicle.

The present disclosure as described above may be realized in the form of computer readable codes recorded in a computer readable medium in which a program is recorded. The computer readable medium may be any type of recording device in which data that can read by a computer (or computer system) is stored. Examples of the computer readable medium may include, but are not limited to, a hard disk drive (HDD), a solid state disk (SSD), a silicon disk drive (SDD), a read-only memory (ROM), a random access memory (RAM), a compact disc read-only memory (CD-ROM), a magnetic tape, a floppy disk and an optical data storage and may be in the form of carrier waves (e.g. transmissions via the Internet). In addition, the computer may include the plurality of controllers 130 according to the present disclosure.

The foregoing descriptions and the accompanying drawings have been presented in order to explain certain principles of the present disclosure. A person having ordinary skill in the art to which the present disclosure relates could make various modifications and variations by combining, dividing, substituting for, or changing the elements without departing from the principle of the present disclosure. The foregoing embodiments disclosed herein shall be interpreted as being illustrative, while not being limitative, of the principle and scope of the present disclosure. One of more of the representative components of the present disclosure may be selectively and operatively combined within the scope of the object of the present disclosure. It should be understood that the scope of the present disclosure shall be defined by the appended Claims and all of their equivalents fall within the scope of the present disclosure.

What is claimed is:

1. A motor control apparatus for a vehicle, comprising:
 a motor comprising a plurality of windings respectively comprised of a plurality of coils;
 a plurality of inverters supplying electric power to one of the plurality of windings to drive the motor; and
 a plurality of controllers controlling the plurality of inverters to control an operation of the motor,
 wherein the plurality of windings, the plurality of inverters and the plurality of controllers are set as a plurality of power supply lines respectively comprised of a single winding, a single inverter and a single controller,
 the plurality of controllers determine a power supply line among the plurality of power supply lines, in which at least one of the winding, the inverter or the controller has malfunctioned, and control electric power that has been supplied via said power supply line determined as having malfunctioned to be supplied via another power supply line among the plurality of power supply lines,
the plurality of windings of the motor comprise at least two windings,
the plurality of inverters comprise at least four inverters, among which two inverters supply electric power to one of the two windings, and
the plurality of controllers comprise at least two controllers respectively controlling at least two inverters among the at least four inverters.

2. The motor control apparatus according to claim 1, further comprising a plurality of sensors provided in the plurality of power supply lines, respectively, the plurality of sensors being configured to detect values of current flowing through the plurality of power supply lines,
wherein the plurality of controllers determine whether or not each of the plurality of power supply lines has malfunctioned by comparing the values of current detected by the plurality of sensors with a preset current value in a normal operating state.

3. The motor control apparatus according to claim 1,
wherein each of the plurality of controllers transmits a state check signal to or receives the state check signal from another of the plurality of controllers to determine whether or not each of the plurality of controllers has malfunctioned, and
wherein each of the plurality of controllers is connected to two inverters among the plurality of inverters via main connection circuits and is connected to one of two other inverters among the plurality of inverters via an auxiliary connection circuit, the two other inverters being connected to the another of the plurality of controllers via main connection circuits.

4. The motor control apparatus according to claim 3, wherein each of the plurality of controllers is set to control two inverters among the plurality of inverters via main connection circuits, and
if a first controller among the plurality of controllers is determined as having malfunctioned, a second controller among the plurality of controllers, which has transmitted the state check signal to or received the state check signal from the first controller, further controls one of the two inverters that has been controlled by the first controller.

5. The motor control apparatus according to claim 1, further comprising a malfunction determination controller determining whether or not each of the plurality of controllers has malfunctioned,
wherein, if a first controller among the plurality of controllers is determined as having malfunctioned, the malfunction determination controller controls the plurality of controllers so that electric power that has been supplied via a power supply line among the plurality of power supply lines, in which the first controller is included, supplements power of another power supply line among the plurality of power supply lines.

6. The motor control apparatus according to claim 1, wherein the plurality of coils comprise six coils.

7. A motor control apparatus for a vehicle, comprising:
a motor comprising a plurality of windings respectively comprised of a plurality of coils;
a plurality of inverters supplying electric power to one of the plurality of windings to drive the motor; and
a plurality of controllers controlling the plurality of inverters to control an operation of the motor,
wherein the plurality of windings, the plurality of inverters and the plurality of controllers are set as a plurality of power supply lines respectively comprised of a single winding, a single inverter and a single controller,
the plurality of controllers determine a power supply line among the plurality of power supply lines, in which at least one of the winding, the inverter or the controller has malfunctioned, and control electric power that has been supplied via said power supply line determined as having malfunctioned to be supplied via another power supply line among the plurality of power supply lines, and
each of the plurality of controllers is connected to two inverters among the plurality of inverters via main connection circuits and is connected to two other inverters among the plurality of inverters via auxiliary connection circuits, the two other inverters being connected to the another of the plurality of controllers via main connection circuits.

8. The motor control apparatus according to claim 7, wherein each of the plurality of controllers transmits a state check signal to or receives the state check signal from another of the plurality of controllers to determine whether or not each of the plurality of controllers has malfunctioned.

9. The motor control apparatus according to claim 8, wherein each of the plurality of controllers is set to control the two inverters via the main connection circuits,
if a first controller among the plurality of controllers is determined as having malfunctioned, a second controller among the plurality of controllers, which has transmitted the state check signal to or received the state check signal from the first controller, further controls the two inverters that has been controlled by the first controller via the auxiliary connection circuits.

10. A method of controlling a motor for a vehicle, the motor including a plurality of windings respectively comprised of a plurality of coils, the method comprising:
controlling a plurality of inverters driving the motor using a plurality of controllers by supplying electric power to one winding among the plurality of windings;
setting the plurality of windings, the plurality of inverters and the plurality of controllers as a plurality of power supply lines respectively comprised of a single winding among the plurality of windings, a single inverter among the plurality of inverters, and a single controller among the plurality of controllers; and
determining a power supply line among the plurality of power supply lines, in which at least one of the winding, the inverter or the controller has malfunctioned, as having malfunctioned; and
controlling electric power that has been supplied via said power supply line determined as having malfunctioned to be supplied via another power supply line among the plurality of power supply lines,
wherein the plurality of windings of the motor comprise at least two windings,
the plurality of inverters comprise at least four inverters, among which two inverters supply electric power to one of the two windings, and
the plurality of controllers comprise at least two controllers respectively controlling at least two inverters among the at least four inverters.

11. The method according to claim 10, wherein the determining of the power supply line as having malfunctioned includes determining whether or not each of the plurality of power supply lines has malfunctioned by comparing values of current detected by a plurality of sensors provided on the plurality of power supply lines with a preset current value in a normal operating state.

12. The method according to claim 10, wherein the determining of the power supply line as having malfunctioned includes determining whether or not the controller has malfunctioned, based on a state check signal that each of the plurality of controllers has transmitted to or received from another controller among the plurality of controllers.

13. The method according to claim 12, wherein, in the controlling of the electric power to supplement power of the another power supply line, a second controller among the plurality of controllers, which has transmitted the state check signal to or received the state check signal from a first controller determined as having malfunctioned, further controls at least one of inverters that have been controlled by the second controller.

14. The method according to claim 10, wherein, in the determining of the power supply line as having malfunctioned, a malfunction determination controller connected to the plurality of controllers determines whether or not each of the plurality of controllers has malfunctioned.

15. A motor control apparatus for a vehicle, comprising:
a motor comprising at least two windings respectively comprised of a plurality of coils;
a plurality of inverters supplying electric power to one of the at least two windings to drive the motor; and
at least two controllers respectively controlling at least two inverters to control an operation of the motor,
wherein at least two windings, the plurality of inverters and at least two controllers are set as a plurality of power supply lines respectively comprised of a single winding, a single inverter and a single controller,
wherein the plurality of power supply lines comprises a first power supply line for one of two controllers, a first inverter and a first winding, a second power supply line for one of two controllers, a second inverter and the first winding, a third power supply line for one of two controllers, a third inverter and a second winding, and a fourth power supply line for one of two controllers, a fourth inverter and the second winding,
wherein at least two controllers determine whether at least one of power supply line among the plurality of power supply lines is abnormal, and control at least two inverters to increase amounts of current supplied via normal power supply lines.

16. The motor control apparatus according to claim 15, further comprising a plurality of sensors provided on the plurality of power supply lines, respectively, to detect current values flowing through the plurality of respective power supply lines,
wherein at least two controllers determine whether each power supply line is abnormal based on the current values detected by the plurality of sensors.

17. The motor control apparatus according to claim 15, wherein the first power supply line includes a first controller, the first inverter and the first winding, the second power supply line includes the first controller, the second inverter and the first winding, the third power supply line includes a second controller, the third inverter and the second winding, and the fourth power supply line includes the second controller, the fourth inverter and the second winding.

18. The motor control apparatus according to claim 17, wherein the first controller and second controller control at least two inverters to increase amounts of current supplied via the normal power supply lines, so that a total amount of current equal to 100% of the rate current is supplied to the motor.

\* \* \* \* \*